United States Patent
Sugeta et al.

(10) Patent No.: US 7,235,345 B2
(45) Date of Patent: Jun. 26, 2007

(54) AGENT FOR FORMING COATING FOR NARROWING PATTERNS AND METHOD FOR FORMING FINE PATTERN USING THE SAME

(75) Inventors: Yoshiki Sugeta, Kanagawa (JP); Fumitake Kaneko, Samukawa-machi (JP); Toshikazu Tachikawa, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/471,772

(22) PCT Filed: Nov. 5, 2002

(86) PCT No.: PCT/JP02/11498

§ 371 (c)(1),
(2), (4) Date: Mar. 2, 2004

(87) PCT Pub. No.: WO03/040832

PCT Pub. Date: May 15, 2003

(65) Prior Publication Data

US 2004/0137378 A1    Jul. 15, 2004

(30) Foreign Application Priority Data

Nov. 5, 2001  (JP) .............................. 2001-339309
Mar. 22, 2002  (JP) .............................. 2002-080517

(51) Int. Cl.
*G03C 5/00*   (2006.01)
(52) U.S. Cl. .................... 430/273.1; 430/313; 430/315; 430/322; 430/324; 430/330; 427/271; 427/372.2; 427/384; 427/385.5; 438/760; 524/555; 524/556; 525/206; 526/263; 526/316.4; 548/325.5

(58) Field of Classification Search ............. 430/273.1, 430/313, 315, 322, 324, 330; 427/271, 372.2, 427/384, 385.5; 438/760; 524/555, 556; 525/206; 526/263; 548/316.4, 325.5
See application file for complete search history.

(56) References Cited

U.S. PATENT DOCUMENTS

| 5,858,620 | A | 1/1999 | Ishibashi et al. |
| 6,486,058 | B1 * | 11/2002 | Chun .......................... 438/637 |

FOREIGN PATENT DOCUMENTS

| JP | 64-023535 | 1/1989 |
| JP | 01-307228 | 12/1989 |
| JP | 04-364021 | 12/1992 |
| JP | 05-166717 | 7/1993 |
| JP | 05-241348 | 9/1993 |
| JP | 07-045510 | 2/1995 |
| JP | 10-073927 | 3/1998 |
| JP | 11-283910 | 10/1999 |
| JP | 2000-347414 | 12/2000 |
| JP | 2001-281886 | 1/2001 |
| WO | 01/00735 | 1/2001 |

* cited by examiner

*Primary Examiner*—Christopher G. Young
(74) *Attorney, Agent, or Firm*—Wenderoth, Lind & Ponack, L.L.P.

(57) ABSTRACT

It is disclosed an over-coating agent for forming fine patterns which is applied to cover a substrate having photoresist patterns thereon and allowed to shrink under heat so that the spacing between the adjacent photoresist patterns is lessened, further characterized by containing a water-soluble polymer and a surfactant. Also disclosed is a method of forming fine-line patterns using the over-coating agent. According to the invention, one can obtain fine-line patterns which exhibit good profiles while satisfying the characteristics required of semiconductor devices, being excellent in controlling the dimension of patterns.

6 Claims, No Drawings

AGENT FOR FORMING COATING FOR NARROWING PATTERNS AND METHOD FOR FORMING FINE PATTERN USING THE SAME

TECHNICAL FIELD

This invention relates to an over-coating agent for forming fine patterns in the field of photolithographic technology and a method of forming fine-line patterns using such agent. More particularly, the invention relates to an over-coating agent for forming or defining fine-line patterns, such as hole patterns and trench patterns, that can meet today's requirements for higher packing densities and smaller sizes of semiconductor devices.

BACKGROUND ART

In the manufacture of electronic components such as semiconductor devices and liquid-crystal devices, there is employed the photolithographic technology which, in order to perform a treatment such as etching on the substrate, first forms a film (photoresist layer) over the substrate using a so-called radiation-sensitive photoresist which is sensitive to activating radiations, then performs exposure of the film by selective illumination with an activating radiation, performs development to dissolve away the photoresist layer selectively to form an image pattern (photoresist pattern), and forms a variety of patterns including contact providing patterns such as a hole pattern and a trench pattern using the photoresist pattern as a protective layer (mask pattern). photoresist pattern as a protective layer (mask pattern).

With the recent increase in the need for higher packing densities and smaller sizes of semiconductor devices, increasing efforts are being made to form sufficiently fine-line patterns and submicron-electronic fabrication capable of forming patterns with linewidths of no more than 0.20 µm is currently required. As for the activating light rays necessary in the formation of mask patterns, short-wavelength radiations such as KrF, ArF and $F_2$ excimer laser beams and electron beams are employed. Further, active R&D efforts are being made to find photoresist materials as mask pattern formers that have physical properties adapted to those short-wavelength radiations.

In addition to those approaches for realizing submicron-electronic fabrication which are based on photoresist materials, active R&D efforts are also being made on the basis of pattern forming method with a view to finding a technology that can provide higher resolutions than those possessed by photoresist materials.

For example, JP-5-166717A discloses a method of forming fine patterns which comprises the steps of defining patterns (=photoresist-uncovered patterns) into a pattern-forming resist on a substrate, then coating over entirely the substrate with a mixing generating resist that is to be mixed with said pattern-forming resist, baking the assembly to form a mixing layer on both sidewalls and the top of the pattern-forming resist, and removing the non-mixing portions of said mixing generating resist such that the feature size of the photoresist-uncovered pattern is reduced by an amount comparable to the dimension of said mixing layer. JP-5-241348 discloses a pattern forming method comprising the steps of depositing a resin, which becomes insoluble in the presence of an acid, on a substrate having formed thereon a resist pattern containing an acid generator, heat treating the assembly so that the acid is diffused from the resist pattern into said resin insoluble in the presence of an acid to form a given thickness of insolubilized portion of the resist near the interface between the resin and the resist pattern, and developing the resist to remove the resin portion through which no acid has been diffused, thereby ensuring that the feature size of the pattern is reduced by an amount comparable to the dimension of said given thickness.

However, in these methods, it is difficult to control the thickness of layers to be formed on the sidewalls of resist patterns. In addition, the in-plane heat dependency of wafers is as great as ten-odd nanometers per degree Celsius, so it is extremely difficult to keep the in-plane uniformity of wafers by means of the heater employed in current fabrication of semiconductor devices and this leads to the problem of occurrence of significant variations in pattern dimensions.

Another approach known to be capable of reducing pattern dimensions is by fluidizing resist patterns through heat treatment and the like. For example, JP-1-307228A discloses a method comprising the steps of forming a resist pattern on a substrate and applying heat treatment to deform the cross-sectional shape of the resist pattern, thereby defining a fine pattern. In addition, JP-4-364021A discloses a method comprising the steps of forming a resist pattern and heating it to fluidize the resist pattern, thereby changing the dimensions of its resist pattern to form or define a fine-line pattern.

In these methods, the wafer's in-plane heat dependency is only a few nanometers per degree Celsius and is not very problematic. On the other hand, it is difficult to control the resist deformation and fluidizing on account of heat treatment, so it is not easy to provide a uniform resist pattern in a wafer's plane.

An evolved version of those methods is disclosed in JP-7-45510A and it comprises the steps of forming a resist pattern on a substrate, forming a stopper resin on the substrate to prevent excessive thermal fluidizing of the resist pattern, then applying heat treatment to fluidize the resist so as to change the dimensions of its pattern, and thereafter removing the stopper resin to form or define a fine-line pattern. As the stopper resin, specifically, polyvinyl alcohol is employed. However, polyvinyl alcohol is not highly soluble in water and cannot be readily removed completely by washing with water, introducing difficulty in forming a pattern of good profile. The pattern formed is not completely satisfactory in terms of stability over time. In addition, polyvinyl alcohol cannot be applied efficiently by coating. Because of these and other problems, the method disclosed in JP-7-45510 has yet to be adopted commercially.

Further, microfoaming is a problem that currently affects the application of a coating material to a substrate having a photoresist pattern. Since this problem is said to have something to do with the generation of pattern defects, commonly referred to simply as defects, coating materials are required that can also solve the problem of defects.

JP 2001-281886A discloses a method comprising the steps of covering a surface of a resist pattern with an acidic film made of a resist pattern size reducing material containing a water-soluble resin, rendering the surface layer of the resist pattern alkali-soluble, then removing said surface layer and the acidic film with an alkaline solution to reduce the feature size of the resist pattern. JP-2002-184673A discloses a method comprising the steps of forming a resist pattern on a substrate, then forming a film containing a water-soluble film forming component on said resist pattern, heat treating said resist pattern and film, and immersing the assembly in an aqueous solution of tetramethylammonium hydroxide, thereby forming a fine-line resist pattern without involving a dry etching step. However, both methods are simply directed to reducing the size of resist trace patterns themselves and therefore are totally different from the present invention in object.

DISCLOSURE OF INVENTION

An object of the present invention is to provide an over-coating agent for forming fine patterns. It has high ability to control pattern dimensions and provides fine-line patterns that have a satisfactory profile and satisfy the characteristics required of semiconductor devices. Another object of the invention is to provide a method of forming fine trace patterns using the over-coating agent.

In order to attain the first object, the present invention provides an over-coating agent for forming fine patterns which is applied to cover a substrate having photoresist patterns thereon and allowed to shrink under heat so that the spacing between the adjacent photoresist patterns is lessened, further characterized by containing a water-soluble polymer and a surfactant.

In a preferred embodiment, the surfactant is at least one member selected from the group consisting of N-alkylpyrrolidones, quaternary ammonium salts and phosphate esters of polyoxyethylene.

In order to attain the second object, the present invention provides a method of forming fine patterns comprising the steps of covering a substrate having thereon photoresist patterns with the above-described over-coating agent for forming fine patterns, then applying heat treatment to shrink the applied over-coating agent under the action of heat so that the spacing between the adjacent photoresist patterns is lessened, and subsequently removing the applied film of the over-coating agent.

In a preferred embodiment, the heat treatment is performed by heating the assembly at a temperature that does not cause thermal fluidizing of the photoresist patterns on the substrate.

BEST MODE FOR CARRYING OUT THE INVENTION

The over-coating agent of the invention for forming fine features of patterns is applied to cover a substrate, having photoresist patterns (mask patterns) thereon, including patterns typified by hole patterns or trench patterns, each of these patterns are defined by spacing between the adjacent photoresist patterns (mask patterns). Upon heating, the applied film of over-coating agent shrinks to increase the width of each of the photoresist patterns, thereby narrowing or lessening hole patterns or trench patterns as defined by spacing between the adjacent photoresist patterns and, thereafter, the applied film is removed completely to form or define fine patterns.

The over-coating agent of the invention for forming fine patterns contains a water-soluble polymer and a surfactant.

The water-soluble polymer may be any polymer that can dissolve in water at room temperature and various types may be employed without particular limitation; preferred examples include acrylic polymers, vinyl polymers, cellulosic derivatives, alkylene glycol polymers, urea polymers, melamine polymers, epoxy polymers and amide polymers.

Exemplary acrylic polymers include polymers and copolymers having monomeric components, such as acrylic acid, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, acryloylmorpholine, etc.

Exemplary vinyl monomers include polymers and copolymers having monomeric components, such as N-vinylpyrrolidone, vinyl imidazolidinone, vinyl acetate, etc.

Exemplary cellulosic derivatives include hydroxypropylmethyl cellulose phthalate, hydroxypropylmethyl cellulose acetate phthalate, hydroxypropylmethyl cellulose hexahydrophthalate, hydroxypropylmethyl cellulose acetate succinate, hydroxypropylmethyl cellulose, hydroxypropyl cellulose, hydroxyethyl cellulose, cellulose acetate hexahydrophthalate, carboxymethyl cellulose, ethyl cellulose, methylcellulose, etc.

Exemplary alkylene glycol polymers include addition polymers and copolymers of ethylene glycol, propylene glycol, etc.

Exemplary urea polymers include those having methylolurea, dimethylolurea, ethyleneurea, etc. as components.

Exemplary melamine polymers include those having methoxymethylated melamine, methoxymethylated isobutoxymethylated melamine, methoxyethylated melamine, etc. as components.

Among epoxy polymers and amide polymers, those which are water-soluble may also be employed.

It is particularly preferred to employ at least one member selected from the group consisting of alkylene glycol polymers, cellulosic derivatives, vinyl polymers and acrylic polymers. Acrylic polymers are most preferred since they provide ease in pH adjustment. Copolymers comprising acrylic polymers and water-soluble polymers other than acrylic polymers are also preferred since during heat treatment, the efficiency of shrinking the spacing between the adjacent photoresist patterns (mask patterns) can be increased while maintaining the shape of the photoresist pattern. The water-soluble polymers can be employed either singly or in combination.

When water-soluble polymers are used as copolymers, the proportions of the components are not limited to any particular values. However, if stability over time is important, the proportion of the acrylic polymer is preferably adjusted to be larger than those of other building polymers. Other than by using excessive amounts of the acrylic polymer, better stability over time can also be obtained by adding acidic compounds such as p-toluenesulfonic acid and dodecylbenzenesulfonic acid.

The surfactant is not limited to any particular types, except that when it is added to the water-soluble polymer, it must exhibit certain characteristics such as high solubility, non-formation of a suspension and miscibility with the polymer component. The use of such surfactants that satisfy these characteristics can effectively prevent the generation of defects that has been problems in conventional methods, which is considered to be pertinent to microfoaming upon applying over-coating materials on the substrate.

Suitable surfactants include N-alkylpyrrolidones, quaternary ammonium salts and phosphate esters of polyoxyethylene.

N-alkylpyrrolidones as surfactant are preferably represented by the following general formula (I):

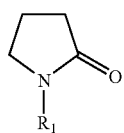

where $R_1$ is an alkyl group having at least 6 carbon atoms.

Specific examples of N-alkylpyrrolidones as surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among these, N-octyl-2-pyrrolidone ("SURFADONE LP 100" of ISP Inc.) is preferably used.

Quaternary ammonium salts as surfactant are preferably represented by the following general formula (II):

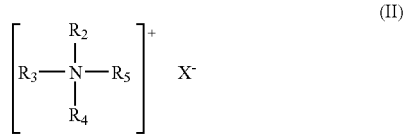

where $R_2$, $R_3$, $R_4$ and $R_5$ are each independently an alkyl group or a hydroxyalkyl group (provided that at least one of them is an alkyl or hydroxyalkyl group having not less than 6 carbon atoms); $X^-$ is a hydroxide ion or a halogenide ion.

Specific examples of quaternary ammonium salts as surfactant include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide and octadecyltrimethylammonium hydroxide. Among these, hexadecyltrimethylammonium hydroxide is preferably used.

Phosphate esters of polyoxyethylene are preferably represented by the following general formula (III):

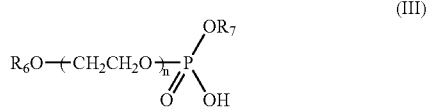

where $R_6$ is an alkyl or alkylaryl group having 1–10 carbon atoms; $R_7$ is a hydrogen atom or $(CH_2CH_2O)R_6$ (where $R_6$ is as defined above); n is an integer of 1–20.

To mention specific examples, phosphate esters of polyoxyethylene that can be used as surfactants are commercially available under trade names "PLYSURF A212E" and "PLYSURF A210G" from Dai-ichi Kogyo Seiyaku Co., Ltd.

Among these surfactants, phosphate esters of phosphate esters of polyoxyethylene are preferable employed in view of suppressing the generation of defects.

The amount of the surfactant is preferably about 0.1–10 mass %, more preferably about 0.2–2 mass %, of the over-coating agent (in terms of solids content). If the amount of the surfactant is beyond the aforementioned ranges, it may cause the variations in the percent shrinkage of patterns, potentially depending on the wafer's in-plane uniformity which is caused by the deterioration of coating property, and also may cause the occurrence of defects that are considered to be pertinent to microfoaming on the over-coating material.

For special purposes such as preventing the generation of impurities and pH adjustment, the over-coating agent for forming fine patters of the present invention may additionally contain water-soluble amines.

Exemplary water-soluble amines include amines having pKa (acid dissociation constant) values of 7.5–13 in aqueous solution at 25° C. Specific examples include the following: alkanolamines, such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, 1,4-butanediamine, N-ethylethylenediamine, 1,2-propanediamine, 1,3-propanediamine and 1,6-hexanediamine; aliphatic amines, such as triethylamine, 2-ethylhexylamine, dioctylamine, tributylamine, tripropylamine, triallylamine, heptylamine and cyclohexylamine; aromatic amines such as benzylamine and diphenylamine; and cyclic amines, such as piperazine, N-methyl-piperazine and hydroxyethylpiperazine. Preferred water-soluble amines are those having boiling points of 140° C. (760 mmHg) and above, as exemplified by monoethanolamine and triethanolamine.

If the water-soluble amine is to be added, it is preferably incorporated in an amount of about 0.1–30 mass %, more preferably about 2–15 mass %, of the over-coating agent (in terms of solids content). If the water-soluble amine is incorporated in an amount of less than 0.1 mass %, the coating fluid may deteriorate over time. If the water-soluble amine is incorporated in an amount exceeding 30 mass %, the photoresist pattern being formed may deteriorate in shape.

For such purposes as reducing the dimensions of patterns and controlling the occurrence of defects, the over-coating agent for forming fine patterns may further optionally contain non-amine based, water-soluble organic solvents.

As such non-amine based, water-soluble organic solvents, any non-amine based organic solvents that can mix with water may be employed and they may be exemplified by the following: sulfoxides, such as dimethyl sulfoxide; sulfones, such as dimethylsulfone, diethylsulfone, bis(2-hydroxyethyl)sulfone and tetramethylenesulfone; amides, such as N,N-dimethylformamide, N-methylformamide, N,N-dimethylacetamide, N-methylacetamine and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobuthyl ether, ethylene glycol monomethyl ether acetate, ethylene glycol monoethyl ether acetate, diethylene glycol, diethylene glycol monomethyl ether, diethylene glycol monoethyl ether, diethylene glycol monobuthyl ether, propylene glycol, propylene glycol monomethyl ether, glycerol, 1,2-butylene glycol, 1,3-butylene glycol and 2,3-butylene glycol. Among those mentioned above, polyhydric alcohols and their derivatives are preferred for the purposes of reducing the dimensions of patterns and controlling the occurrence of defects and glycerol is particularly preferred. The non-amine based, water-soluble organic solvents may be used either singly or in combination.

If the non-amine based, water-soluble organic solvent is to be added, it is preferably incorporated in an amount of about 0.1–30 mass %, more preferably about 0.5–15 mass %, of the water-soluble polymer. If the non-amine based, water-soluble organic solvent is incorporated in an amount of less than 0.1 mass %, its defect reducing effect tends to decrease. Beyond 30 mass %, a mixing layer is liable to form at the interface with the photoresist pattern.

The over-coating agent of the invention for forming fine patterns is preferably used as an aqueous solution at a concentration of 3–50 mass %, more preferably at 5–30 mass %. If the concentration of the aqueous solution is less than 3 mass %, poor coverage of the substrate may result. If the concentration of the aqueous solution exceeds 50 mass %, there is no appreciable improvement in the intended effect that justifies the increased concentration and the solution cannot be handled efficiently.

As already mentioned, the over-coating agent of the invention for forming fine patterns is usually employed as an aqueous solution using water as the solvent. A mixed solvent system comprising water and an alcoholic solvent may also be employed. Exemplary alcoholic solvents are monohydric alcohols including methyl alcohol, ethyl alcohol, propyl alcohol and isopropyl alcohol. These alcoholic solvents are mixed with water in amounts not exceeding about 30 mass %.

The over-coating agent of the invention for forming fine patterns has the advantage of improving resolution beyond the values inherent in photoresist materials and it can attain wafer's in-plane uniformity by eliminating the pattern variations in the plane of the substrate. Further, the over-coating agent of the invention can form patterns of good profile by eliminating the irregularities (roughness) in the shape of patterns due, for example, to the reflection of fluorescent light from the substrate. Yet another advantage of the over-coating agent is its ability to check the occurrence of defects.

The method of forming fine-line patterns according to the second aspect of the invention comprises the steps of covering a substrate having photoresist patterns thereon with the above-described over-coating agent for forming fine patterns, then applying heat treatment to shrink the applied over-coating agent under the action of heat so that the spacing between the adjacent photoresist patterns is reduced, and subsequently removing the applied film of the over-coating agent.

The method of preparing the substrate having photoresist patterns thereon is not limited to any particular type and it can be prepared by conventional methods employed in the fabrication of semiconductor devices, liquid-crystal display devices, magnetic heads and microlens arrays. In an exemplary method, a photoresist composition of chemically amplifiable or other type is spin- or otherwise coated on a substrate such as a silicon wafer and dried to form a photoresist layer, which is illuminated with an activating radiation such as ultraviolet, deep-ultraviolet or excimer laser light through a desired mask pattern using a reduction-projection exposure system or subjected to electron beam photolithography, then heated and developed with a developer such as an alkaline aqueous solution, typically a 1–10 mass % tetramethylammonium hydroxide (TMAH) aqueous solution, thereby forming a photoresist pattern on the substrate.

The photoresist composition serving as a material from which photoresist patterns are formed is not limited in any particular way and any common photoresist compositions may be employed including those for exposure to i- or g-lines, those for exposure with an excimer laser (e.g. KrF, ArF or $F_2$) and those for exposure to EB (electron beams).

After thusly forming the photoresist pattern as a mask pattern, the over-coating agent for forming fine patterns is applied to cover entirely the substrate. After applying the over-coating agent, the substrate may optionally be pre-baked at a temperature of 80–100° C. for 30–90 seconds.

The over-coating agent may be applied by any methods commonly employed in the conventional heat flow process. Specifically, an aqueous solution of the over-coating agent for forming fine patterns is applied to the substrate by any known application methods including bar coating, roll coating and whirl coating with a spinner.

In the next step, heat treatment is performed to cause thermal shrinkage of the film of the over-coating agent. Under the resulting force of thermal shrinkage of the film, the dimensions of the photoresist pattern in contact with the film will increase by an amount equivalent to the thermal shrinkage of the film and, as the result, the photoresist pattern widens and accordingly the spacing between the adjacent photoresist patterns lessens. The spacing between the adjacent photoresist patterns determines the diameter or width of the patterns to be finally obtained, so the decrease in the spacing between the adjacent photoresist patterns contributes to reducing the diameter of each element of hole patterns or the width of each element of trench patterns, eventually leading to the definition of a pattern with smaller feature sizes.

The heating temperature is not limited to any particular value as long as it is high enough to cause thermal shrinkage of the film of the over-coating agent and form or define a fine pattern. Heating is preferably done at a temperature that will not cause thermal fluidizing of the photoresist pattern. The temperature that will not cause thermal fluidizing of the photoresist pattern is such a temperature that when a substrate on which the photoresist pattern has been formed but no film of the over-coating agent has been formed is heated, the photoresist pattern will not experience any dimensional changes (for example, dimensional changes due to spontaneously fluidized deforming). Performing a heat treatment under such temperature conditions is very effective for various reasons, e.g. a fine-line pattern of good profile can be formed more efficiently and the duty ratio in the plane of a wafer, or the dependency on the spacing between photoresist patterns in the plane of a wafer, can be reduced. Considering the softening points of a variety of photoresist compositions employed in current photolithographic techniques, the preferred heat treatment is usually performed within a temperature range of about 80–160° C. for 30–90 seconds, provided that the temperature is not high enough to cause thermal fluidizing of the photoresist.

The thickness of the film of the over-coating agent for the formation of fine-line patterns is preferably just comparable to the height of the photoresist pattern or high enough to cover it.

In the subsequent step, the remaining film of the over-coating agent on the patterns is removed by washing with an aqueous solvent, preferably pure water, for 10–60 seconds. Prior to washing with water, rinsing may optionally be performed with an aqueous solution of alkali (e.g. tetramethylammonium hydroxide (TMAH) or choline). The over-coating agent of the present invention is easy to remove by washing with water and it can be completely removed from the substrate and the photoresist pattern.

As a result, each pattern on the substrate has a smaller feature size because each pattern is defined by the narrowed spacing between the adjacent widened photoresist patterns.

The fine-line pattern thus formed using the over-coating agent of the present invention has a pattern size smaller than the resolution limit attainable by the conventional methods. In addition, it has a good enough profile and physical properties that can fully satisfy the characteristics required of semiconductor devices.

The technical field of the present invention is not limited to the semiconductor industry and it can be employed in a wide range of applications including the fabrication of liquid-crystal display devices, the production of magnetic heads and even the manufacture of microlens arrays.

EXAMPLES

The following examples are provided for further illustrating the present invention but are in no way to be taken as limiting. Unless otherwise noted, all amounts of ingredients are expressed in mass %.

Example 1

A substrate was whirl coated with a positive-acting photoresist TDUR-PO36PM (product of Tokyo Ohka Kogyo Co., Ltd.) and baked at 80° C. for 90 seconds to form a photoresist layer in a thickness of 0.48 μm.

The photoresist layer was exposed with a KrF excimer laser exposure unit (FPA-3000 EX3 of Canon Inc.), subjected to heat treatment at 120° C. for 90 seconds and developed with an aqueous solution of 2.38 mass % TMAH (tetramethylammonium hydroxide) to form photoresist patterns which defined hole patterns with an each diameter of 180 nm (i.e., the spacing between the photoresist patterns was 180 nm).

A copolymer of acrylic acid and vinylpyrrolidone [10 g; acrylic acid/vinylpyrrolidone=2:1 (by weight)] and "SURFADONE LP 100", product of ISP Inc., as N-alkylpyrrolidone surfactant (0.02 g) were dissolved in water to prepare an over-coating agent having the overall solids content adjusted to 8.0 mass %.

Then thusly prepared over-coating agent was applied onto the substrate including the hole patterns and subjected to heat treatment at 116° C. for 60 seconds. Subsequently, the over-coating agent was removed using pure water at 23° C. The each diameter of the hole patterns was reduced to about 160 nm. In addition, wafer's in-plane uniformity was good, and the variations in flow-rates were suppressed. The generation of defects, which is considered to be caused by microfoaming upon applying the coating, was suppressed. Furthermore, the thus obtained patterns had a good profile.

Example 2

Photoresist patterns were formed in the same manner as described in Example 1, which defined hole patterns with an each diameter of 180 nm (i.e., the spacing between the photoresist patterns was 180 nm).

A copolymer of acrylic acid and vinylpyrrolidone [10 g; acrylic acid/vinylpyrrolidone=2:1 (by weight)], triethanolamine (0.9 g) and "SURFADONE LP 100", product of ISP Inc., as N-alkylpyrrolidone surfactant (0.02 g) were dissolved in water to prepare an over-coating agent having the overall solids content adjusted to 8.0 mass %.

Then thusly prepared over-coating agent was applied onto the substrate including the hole patterns and subjected to heat treatment at 116° C. for 60 seconds. Subsequently, the over-coating agent was removed using pure water at 23° C. The each diameter of the hole patterns was reduced to about 160 nm. In addition, wafer's in-plane uniformity was good, and the variations in flow-rates were suppressed. The generation of defects, which is considered to be caused by microfoaming upon applying the coating, was suppressed. Furthermore, the thus obtained patterns had a good profile.

Example 3

Photoresist patterns were formed in the same manner as described in Example 1, which defined trench patterns with an each pattern-width of 180 nm (i.e., the spacing between the photoresist patterns was 180 nm).

A copolymer of acrylic acid and vinylpyrrolidone [10 g; acrylic acid/vinylpyrrolidone=2:1 (by weight)], triethanolamine (0.9 g) and a quaternary ammonium salt surfactant [0.02 g; HDTMAH (=hexadecyltrimethylammonium hydroxide); product of Wako Pure Chemical Industries, Ltd.] were dissolved in water to prepare an over-coating agent having the overall solids content adjusted to 8.0 mass %.

Then thusly prepared over-coating agent was applied onto the substrate including the trench patterns and subjected to heat treatment at 116° C. for 60 seconds. Subsequently, the over-coating agent was removed using pure water at 23° C. The each pattern-width of trench patterns was reduced to about 160 nm. In addition, wafer's in-plane uniformity was good, and the variations in flow-rates were suppressed. The generation of defects, which is considered to be caused by microfoaming upon applying the coating, was suppressed. Furthermore, the thus obtained patterns had a good profile.

Example 4

Photoresist patterns were formed in the same manner as described in Example 1, which defined hole patterns with an each diameter of 181.5 nm (i.e., the spacing between the photoresist patterns was 181.5 nm).

A copolymer of acrylic acid and vinylpyrrolidone [6.93 g; acrylic acid/vinylpyrrolidone=2:1 (by weight)] and "PLYSURF A210G", product of Dai-ichi Kogyo Seiyaku Co., Ltd., as a polyoxyethylene phosphate ester based surfactant (0.07 g) were dissolved in water (93 g) to prepare an over-coating agent.

Then thusly prepared over-coating agent was applied onto the substrate including the hole patterns and subjected to heat treatment at 120° C. for 60 seconds. Subsequently, the over-coating agent was removed using pure water at 23° C. The each diameter of the hole patterns was reduced to 161.4 nm. In addition, wafer's in-plane uniformity was good, and the variations in flow-rates were suppressed. The generation of defects, which is considered to be caused by microfoaming upon applying the coating, was effectively suppressed: the numbers of the defects generated in Example 4 were about 15% of the numbers of the defects generated in Examples 1–3. Furthermore, the thus obtained patterns had a good profile.

Example 5

Photoresist patterns were formed in the same manner as described in Example 1, which defined hole patterns with an each diameter of 181.5 nm (i.e., the spacing between the photoresist patterns was 181.5 nm).

A copolymer of acrylic acid and vinylpyrrolidone [6.73 g; acrylic acid/vinylpyrrolidone=2:1 (by weight)], "PLYSURF A210G", product of Dai-ichi Kogyo Seiyaku Co., Ltd., as a polyoxyethylene phosphate ester based surfactant (0.07 g) and glycerol (0.20 g) were dissolved in water (93 g) to prepare an over-coating agent. Then thusly prepared over-coating agent was applied onto the substrate including the hole patterns and subjected to heat treatment at 120° C. for 60 seconds. Subsequently, the over-coating agent was removed using pure water at 23° C. The each diameter of the hole patterns was reduced to 160.2 nm. In addition, wafer's in-plane uniformity was good, and the variations in flow-rates were suppressed. The numbers of the defects caused by microfoaming generated in Example 5 were nearly zero. Furthermore, the thus obtained patterns had a good profile.

Example 6

Photoresist patterns were formed in the same manner as described in Example 1, which defined hole patterns with an each diameter of 181.5 nm (i.e., the spacing between the photoresist patterns was 181.5 nm).

A copolymer of acrylic acid and vinylpyrrolidone [6.73 g; acrylic acid/vinylpyrrolidone=2:1 (by weight)], "PLYSURF A210G", product of Dai-ichi Kogyo Seiyaku Co., Ltd., as a polyoxyethylene phosphate ester based surfactant (0.07 g) and propylene glycol monomethyl ether (0.20 g) were dissolved in water (93 g) to prepare an over-coating agent. Then thusly prepared over-coating agent was applied onto the substrate including the hole patterns and subjected to heat treatment at 120° C. for 60 seconds. Subsequently, the over-coating agent was removed using pure water at 23° C. The each diameter of the hole patterns was reduced to 160.2 nm. In addition, wafer's in-plane uniformity was good, and the variations in flow-rates were reduced. The numbers of the defects caused by microfoaming occurred in Example 6 were nearly zero. Furthermore, the thus obtained patterns had a good profile.

Comparative Example 1

Photoresist patterns were formed in the same manner as described in Example 1, which defined trench patterns with an each pattern-width of 180 nm (i.e., the spacing between the photoresist patterns was 180 nm).

A copolymer of acrylic acid and vinylpyrrolidone [10 g; acrylic acid/vinylpyrrolidone=2:1 (by weight)] was dissolved in water to prepare an over-coating agent having the overall solids content adjusted to 8.0 mass %.

Then thusly prepared over-coating agent was applied onto the substrate including the trench patterns and subjected to heat treatment at 116° C. for 60 seconds. Subsequently, the over-coating agent was removed using pure water at 23° C. The each pattern-width of trench patterns was reduced to about 160 nm. However, the variations in flow-rates were occurred due to wafer's in-plane non-uniformity, which is caused by the deterioration of coating properties. Furthermore, defects that were considered to be caused by microfoaming upon applying the coating were observed.

INDUSTRIAL APPLICABILITY

As described above in detail, according to the present inventions of the over-coating agent for forming fine-line patterns and the method of forming fine-line patterns using the agent, one can obtain fine-line patterns which exhibits a good profile while satisfying the characteristics required of semiconductor devices, being excellent in removing the applied film of the over-coating agent.

The invention claimed is:

1. An over-coating agent for forming fine patterns which is applied to cover a substrate having photoresist patterns thereon and allowed to shrink under heat treatment so that the spacing between the adjacent photoresist patterns is lessened, wherein the heat treatment is performed by heating the substrate at a temperature that does not cause thermal fluidizing of the photoresist patterns on the substrate, further containing a water-soluble polymer and a surfactant in an amount of 0.1–10 mass % of the over-coating agent as solids, wherein the surfactant is at least one member selected from the group consisting of N-alkylpyrrolidones, quaternary ammonium salts and phosphate esters of polyoxyethylene.

2. The over-coating agent for forming fine patterns according to claim 1, wherein the water-soluble polymer is at least one member selected from the group consisting of alkylene glycolic polymers, cellulosic derivatives, vinyl polymers, acrylic polymers, urea polymers, epoxy polymers, melamine polymers and amide polymers.

3. The over-coating agent for forming fine patterns according to claim 1, wherein the water-soluble polymer is at least one member selected from the group consisting of alkylene glycolic polymers, cellulosic derivatives, vinyl polymers and acrylic polymers.

4. The over-coating agent for forming fine patterns according to claim 1, which is an aqueous solution having a concentration of 3–50 mass %.

5. A method of forming fine patterns comprising the steps of:
 covering a substrate having thereon photoresist patterns with the over-coating agent for forming fine patterns of claim 1,
 applying heat treatment to shrink the applied over-coating agent under the action of heat so that the spacing between the adjacent photoresist patterns is lessened, wherein the heat treatment is performed by heating the substrate at a temperature that does not cause thermal fluidizing of the photoresist patterns on the substrate, and
 subsequently removing the applied film of the over-coating agent.

6. The method of forming fine patterns according to claim 5, wherein the applied film of the over-coating agent is removed with water.

* * * * *